United States Patent
Muranaka et al.

(10) Patent No.: US 8,258,698 B2
(45) Date of Patent: Sep. 4, 2012

(54) LIGHT EMITTING DEVICE HAVING A MOLDED BODY WITH A SPECIFIC BARYCENTER

(75) Inventors: Tetsuya Muranaka, Fukuoka-ken (JP); Yasunori Nagahata, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 12/969,752

(22) Filed: Dec. 16, 2010

(65) Prior Publication Data

US 2011/0309736 A1  Dec. 22, 2011

(30) Foreign Application Priority Data

Jun. 21, 2010  (JP) .................................. 2010-140373

(51) Int. Cl.
  *H01J 1/62*  (2006.01)
  *H01L 33/00*  (2010.01)
(52) U.S. Cl. .................. 313/512; 313/110; 313/318.01; 257/100
(58) Field of Classification Search .................. None
  See application file for complete search history.

(56) References Cited

U.S. PATENT DOCUMENTS

| | | | |
|---|---|---|---|
| 6,578,989 B2 * | 6/2003 | Osumi et al. ................... | 313/512 |
| 8,067,779 B2 * | 11/2011 | Muranaka et al. ............... | 257/98 |
| 2008/0237621 A1 * | 10/2008 | Takemoto ....................... | 257/98 |
| 2009/0315048 A1 * | 12/2009 | Fehrer et al. .................... | 257/99 |
| 2010/0171139 A1 | 7/2010 | Muranaka et al. | |

* cited by examiner

*Primary Examiner* — Anh Mai
*Assistant Examiner* — Britt D Hanley
(74) *Attorney, Agent, or Firm* — Turocy & Watson, LLP

(57) ABSTRACT

According to one embodiment, a light emitting device includes a first lead, a light emitting element, a second lead and a molded body. The first lead includes a die pad portion having a major surface and a recess provided in the major surface, and a bent portion bent toward above the major surface. The light emitting element is bonded to a bottom surface of the recess. The second lead with one end portion is opposed to one end portion of the first lead. The molded body covers the light emitting element, the bent portion, the die pad portion, and the one end portion of the second lead, and is made of a resin. A position of barycenter of the molded body is set between a lower surface of the die pad portion and a plane including an upper end of the bent portion.

20 Claims, 5 Drawing Sheets

LIGHT EMITTING DEVICE HAVING A MOLDED BODY WITH A SPECIFIC BARYCENTER

CROSS-REFERENCE TO RELATED APPLICATIONS

This application is based upon and claims the benefit of priority from the prior Japanese Patent Application No. 2010-140373, filed on Jun. 21, 2010; the entire contents of which are incorporated herein by reference.

FIELD

Embodiments described herein relate generally to a light emitting device.

BACKGROUND

Light emitting devices used for vehicle-mounted exterior lights, traffic lights, and various illumination lamps are required to have stable electrical and optical characteristics in high-power and high-temperature operation.

High output power can be achieved by providing a recess in the lead frame to cause light emitted from the light emitting element to be reflected upward. However, to increase reflection by the lead frame, the lead frame needs to be upsized, which results in increasing the volume of the sealing resin.

Typically, the sealing resin has a larger linear expansion coefficient than the lead frame and the light emitting element. Hence, the lead frame and the light emitting element are subjected to compressive stress during temperature decrease, and tensile stress during temperature increase. If the volume of the sealing resin increases, the stress due to temperature change increases. This may cause detachment between the lead frame and the sealing resin, and between the light emitting element and the sealing resin. Thus, the electrical and optical characteristics of the light emitting element may change.

DETAILED DESCRIPTION

According to one embodiment, a light emitting device includes a first lead, a light emitting element, a second lead and a molded body. The first lead includes a die pad portion having a major surface and a recess provided in the major surface, and a bent portion bent toward above the major surface. The light emitting element is bonded to a bottom surface of the recess. The second lead with one end portion is opposed to one end portion of the first lead. The molded body covers the light emitting element, the bent portion, the die pad portion, and the one end portion of the second lead, and is made of a resin. Another end portion of the first lead and another end portion of the second lead are projected from the molded body. A position of barycenter of the molded body is set between a lower surface of the die pad portion on opposite side from the bottom surface of the recess and a plane including an upper end of the bent portion.

Embodiments of the invention will now be described with reference to the drawings.

Figure 1A:
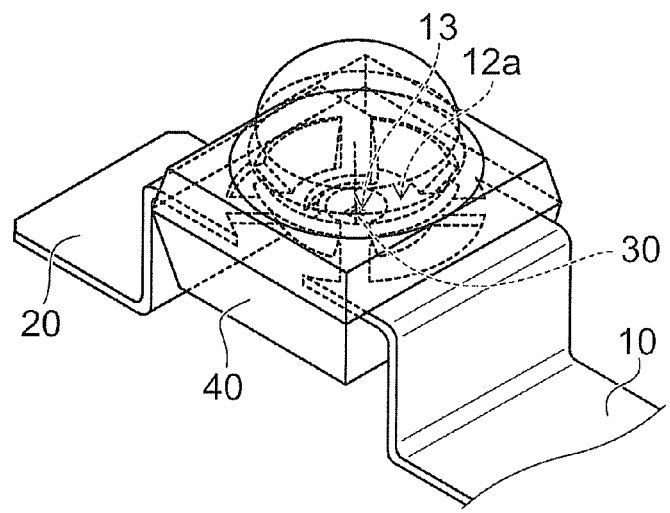
FIG. 1A is a schematic perspective view of a light emitting device according to a first embodiment.
Figure 1B:
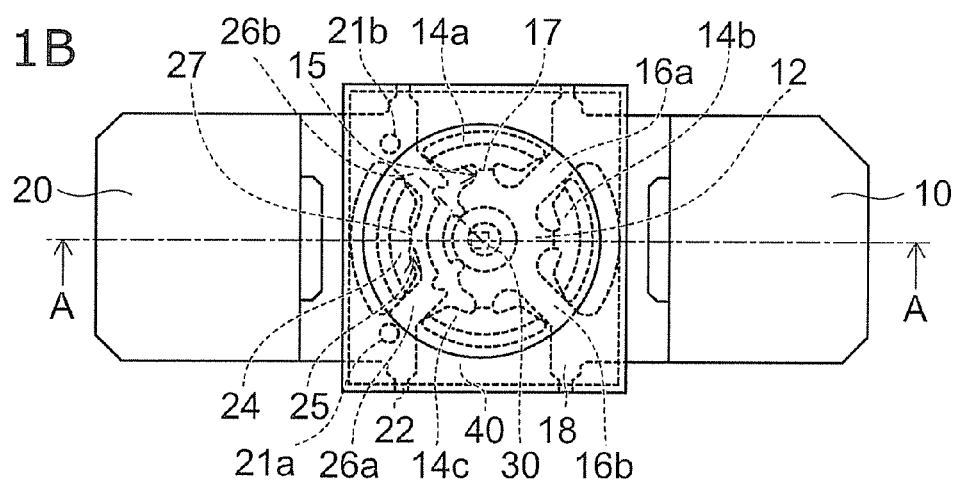
FIG. 1B is a schematic plan view.
Figure 1C:
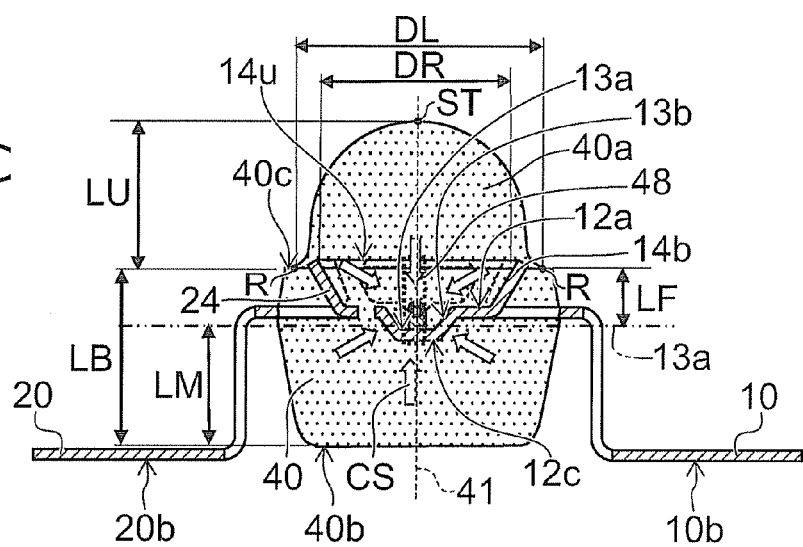
FIG. 1C is a schematic sectional view taken along line A-A.

FIG. 1A is a schematic perspective view of a light emitting device according to a first embodiment, FIG. 1B is a schematic plan view, and FIG. 1C is a schematic sectional view taken along line A-A.

The light emitting device includes a first lead 10, a second lead 20, a light emitting element 30, and a molded body 40 made of a transparent resin.

The first lead 10 includes a die pad portion 12 provided on one end portion side, a bent portion 14 bent toward above the major surface 12a of the die pad portion 12, and the other end portion serving as an outer lead. The die pad portion 12 and the outer lead are connected by a thermally conductive portions 16a, 16b.

The die pad portion 12 includes a recess 13 in the major surface 12a thereof. The recess 13 has a bottom surface 13a and an inclined side surface 13b. To the bottom surface 13a, the light emitting element 30 is bonded with an adhesive or solder material. The bottom surface 13a of the recess 13 has e.g. a diameter of 0.65 mm and a depth of 0.45 mm. The inner diameter DR of the upper end 14u of the bent portion 14 is e.g. 4 mm.

One end portion of the second lead 20 is opposed to one end portion of the first lead 10. The second lead 20 includes a bent portion 24. One end portion of the second lead 20 includes two regions 26a, 26b sandwiching a bent portion 24. When anchor holes 21a, 21b are provided between the two regions 26a, 26b and the outer lead, adhesion between the second lead and the molded body 40 can be improved. Thus, when the region 26b of the second lead 20 is connected to one of the electrodes of the light emitting element 30 by a bonding wire, a wire connection point can be protected. The lead frame is made of e.g. a Cu-based alloy, and has a thickness of e.g. 0.25 mm.

Preferably, a coating can be provided on the major surface 12a of the die pad portion 12, the bottom surface 13a and the side surface 13b of the recess 13, and inner side surfaces of the bent portion 14 to increase the reflectance. Also, a coating can be provided on an inner side surface of the bent portion 24. The coating can be made of e.g. Ag, or Ni/Pd/Au stacked in this order. In this case, for instance, the thickness of Ag is 10 μm, and the thickness of Ni, Pd, and Au is 1 μm, 0.03 μm, and 0.01 μm, respectively.

The molded body 40 is made of a transparent resin such as silicone, epoxy, and acrylic resin, and formed by e.g. transfer molding. The molded body 40 covers the light emitting element 30, the bent portions 14, 24, the die pad portion 12, and suspension pins 18, 22, and penetrates through slits 15, 25. Here, the transparent resin refers to a resin capable of transmitting emission light from the light emitting element 30. That is, the absorption of emission light from the light emitting element 30 by the transparent resin does not need to be zero, but the transparent resin only needs to transmit at least part of the emission light from the light emitting element 30. The first lead 10 and the second lead 20 can be bent to the opposite side from the molded body 40, and their lower surfaces 10b, 20b can be made lower than the lower surface 40b of the molded body 40. This can ensure attachment to a mounting substrate.

The side surface 13b of the recess 13 acts as a first reflector to reflect upward the emission light, thereby increasing the optical output. The bent portions 14, 24 act as a second reflector to reflect upward the light having a large angle from the central axis 41, thereby further increasing the optical output. A convex lens 40a can be formed on the upper surface of the molded body 40. Then, the emission light and the reflection light from the first and second reflector can be collected.

The upper end 14u of the bent portion 14 can be made flush with or above the plane 40c including the lowermost portion R of the ridge line of the convex lens 40a. Then, the lens diameter DL is larger than the inner diameter DR of the upper end 14u of the bent portion 14, and is e.g. 4.4 mm.

If the bent portion 14 is provided on the side of the first lead 10 including at least the die pad portion 12, the reflector effect can be enhanced. If the bent portion 24 is provided also on the second lead 20 side, the reflector effect can be further enhanced. In FIGS. 1A to 1C, the bent portion 14 includes three bent portions 14a, 14b, 14c. The second lead includes a bent portion 24 opposed to the bent portion 14b. However, the layout and number of bent portions are not limited thereto.

The slits 15, 25 provided as described above facilitate press working even for large bent portions 14, 24, and facilitate forming a curved surface as desired.

The light emitting element 30 can include a laminated body made of e.g. $In_x(Ga_yAl_{1-y})_{1-x}P$ ($0 \leq x \leq 1$, $0 \leq y \leq 1$) or $Al_xGa_{1-x}As$ ($0 \leq x \leq 1$), and can emit green to red light. Alternatively, the light emitting element 30 can include a laminated body made of $In_xGa_yAl_{1-x-y}N$ ($0 \leq x \leq 1$, $0 \leq y \leq 1$, $x+y \leq 1$), and can emit in the range of ultraviolet, blue, and green light.

In this embodiment, for instance, the bending angle of the bent portions 14, 24 is set to 45-70 degrees, and the height of the bent portions 14, 24 is set to 0.6-1.0 mm. Then, the half angle at half maximum can be set to 30-40 degrees. Thus, a light flux utilization ratio of 80% or more can be achieved within the effective irradiation angle.

Figure 2A:
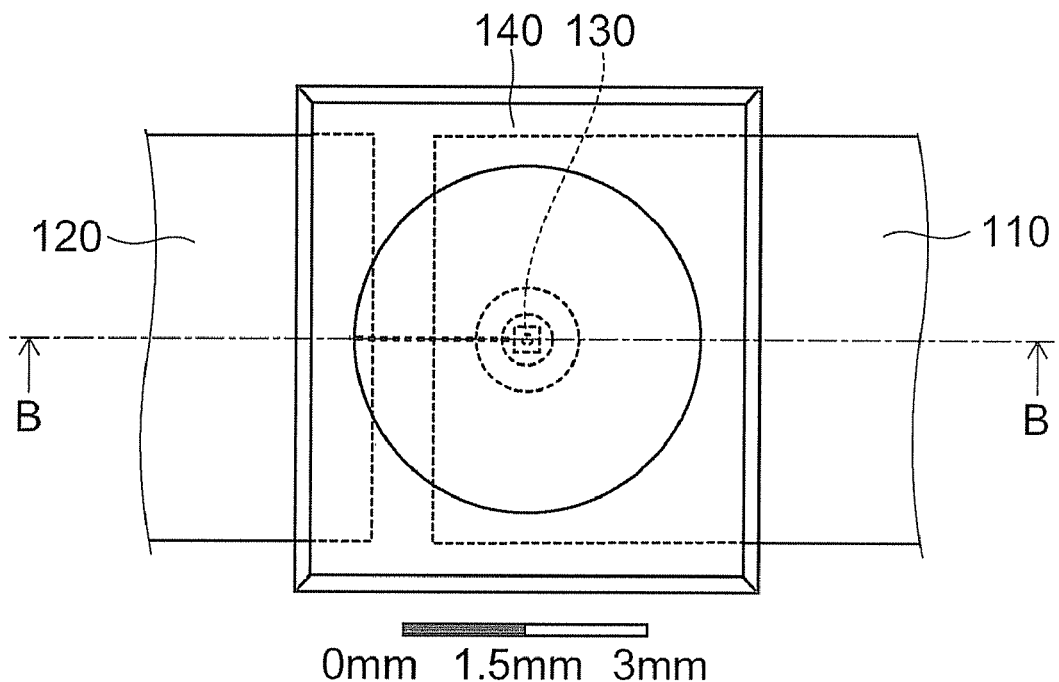
FIG. 2A is a schematic plan view of a light emitting device according to a comparative example.
Figure 2B:
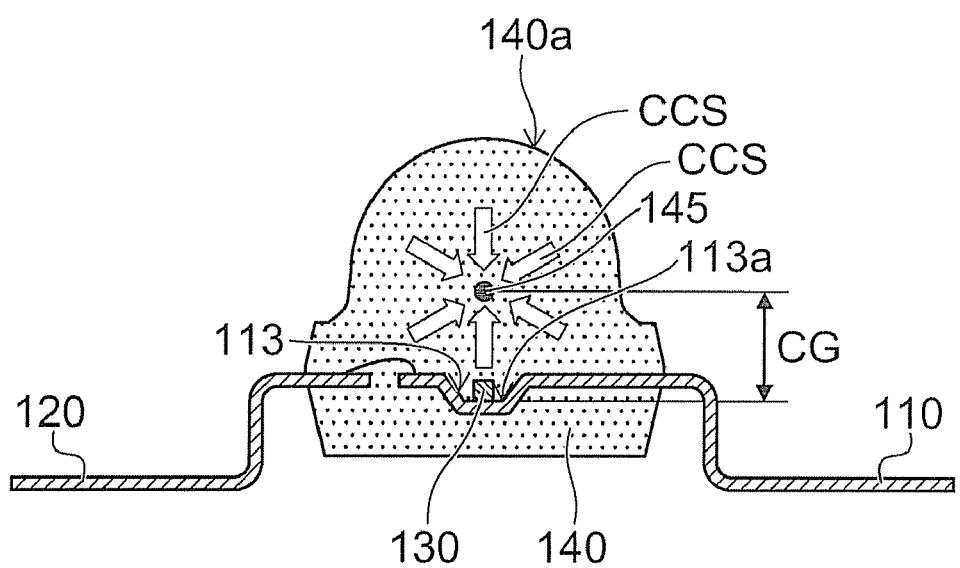
FIG. 2B is a schematic sectional view taken along line B-B.

FIG. 2A is a schematic plan view of a light emitting device according to a comparative example, and FIG. 2B is a schematic sectional view taken along line B-B. The comparative example includes no bent portion. The barycenter 145 of the molded body 140 made of a sealing resin is spaced from the plane including the bottom surface 113a of the recess 113.

Typically, the sealing resin has a larger linear expansion coefficient than the lead frame. Hence, soldering to a mounting substrate performed by a reflow process involves temperature change such as increasing the temperature to approximately 260° C., keeping the temperature to sufficiently heat the solder (e.g., 5 to 10 seconds), and quenching to room temperature.

In this case, the problem is the stress occurring at the time of quenching from 260° C. The molded body 140 made of the sealing resin shrinks, and a compressive stress CCS acts toward its barycenter 145. This compressive stress CCS acts in the direction of pulling upward the light emitting element 130 and the first lead 110. The first lead 110 has high elasticity, and hence has a small amount of displacement. On the other hand, the sealing resin has a large linear expansion coefficient. Thus, the amount of displacement of the molded body 140 due to the compressive stress CCS is larger for a larger distance CG between the barycenter 145 and the bottom surface 113a of the recess 130. When the compressive stress CCS exceeds the adhesion strength between the molded body 140 and the light emitting element 130, and the adhesion strength between the molded body 140 and the first lead 110, detachment and cracking are likely to occur at each interface.

Furthermore, even at temperatures lower than that of the reflow process, prolonged operation in an environment with large temperature change may cause detachment and cracking.

In contrast, in the first embodiment, the bent portion 14, the through hole formed after bending the bent portion 14, and the suspension pins 18, 22 can increase the adhesion strength between the sealing resin 40 and the lead frame (anchor effect). Furthermore, by providing slits 15, 25, the adhesion strength can be further increased.

Furthermore, the first embodiment includes bent portions 14, 24 for reflecting upward the light having a large angle from the central axis 41 of the molded body 40. Of the volume of the molded body 40, the volume above the major surface of the first and second leads 10, 20 increases by the amount of the height of the bent portions 14, 24. The volume of the molded body 40 is e.g. 130 mm$^3$.

FIGS. 3A to 3D are schematic sectional views of a light emitting device used as models for stress simulation.

Figure 3A:
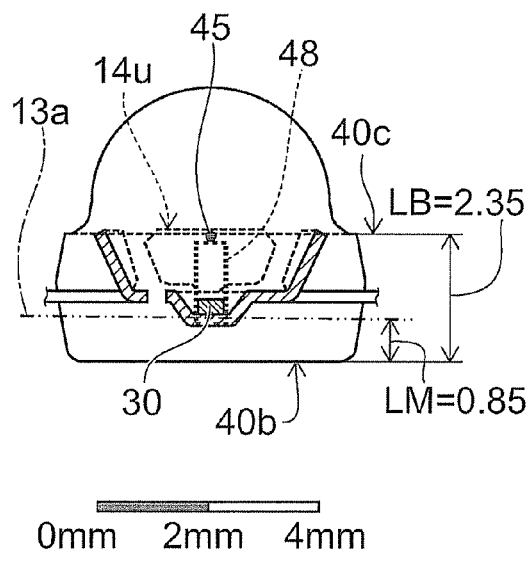
FIGS. 3A to 3D are schematic sectional views of a light emitting device used as models for stress simulation.

In FIG. 3A, the resin thickness LB between the lower surface 40b of the molded body 40 and the plane 40c of the lens is set to 2.35 mm. The resin thickness LM between the lower surface 40b of the molded body 40 and the bottom surface 13a (mount surface) of the recess 13 is set to 0.85 mm. In this case, the barycenter 45 lies in the plane including the upper end 14u of the bent portion 14, and near the central axis 41 (inside the region of the light emitting element 30 as viewed from above). The position of the barycenter 45 can be calculated from the shape of the molded body 40.

Figure 3B:
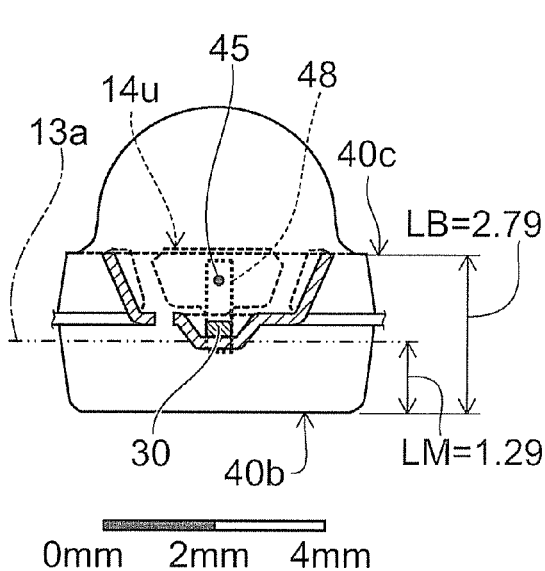

In FIG. 3B, the resin thickness LB is set to 2.79 mm, and the resin thickness LM is set to 1.29 mm. In this case, the barycenter 45 lies at a height of 0.99 mm above the bottom surface 13a and inside the region of the light emitting element 30 as viewed from above.

Figure 3C:
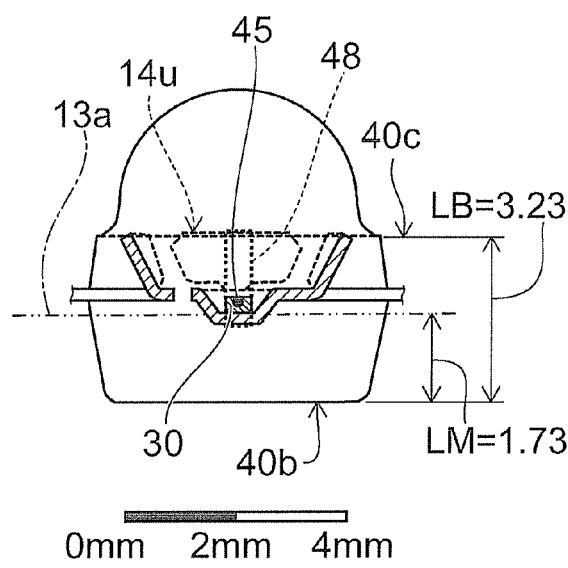

In FIG. 3C, the resin thickness LB is set to 3.23 mm, and the resin thickness LM is set to 1.73 mm. In this case, the barycenter 45 lies at a height of 0.36 mm above the bottom surface 13a and inside the region of the light emitting element 30 as viewed from above.

Figure 3D:
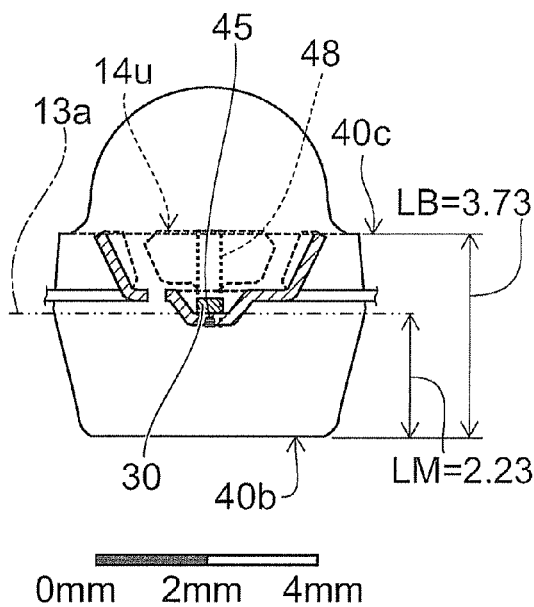

Furthermore, in FIG. 3D, the resin thickness LB is set to 3.73 mm, and the resin thickness LM is set to 2.23 mm. In this case, the barycenter 45 is included in the lower surface 12c of the die pad portion 12 below the bottom surface 13a and lies inside the region of the light emitting element 30 as viewed from above.

In FIGS. 3A to 3D, the resin thickness LF between the lower plane 40c of the lens and the bottom surface 13a is always set to 1.5 mm. The resin thickness LU between the top ST of the lens and the plane 40c is always set to 2.65 mm.

Figure 4A:
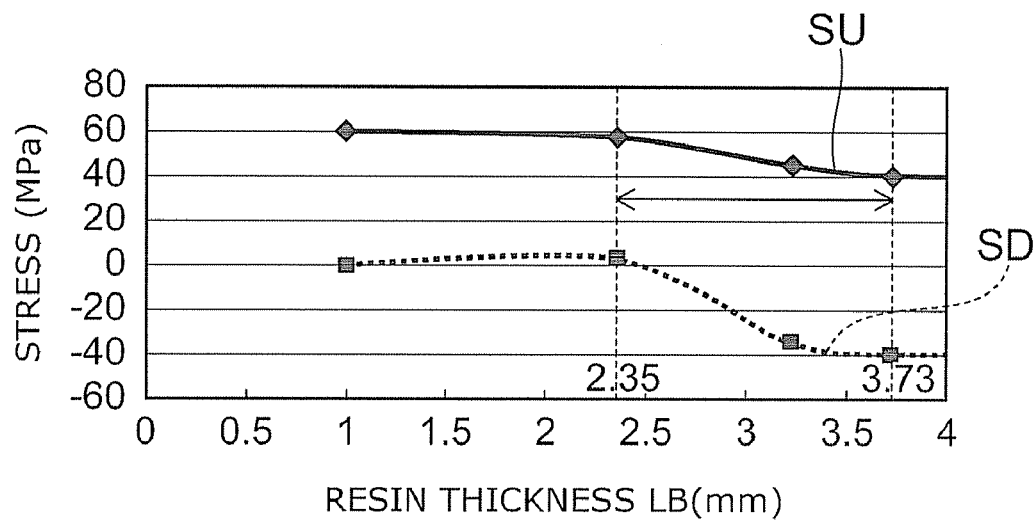
FIG. 4A is a graph showing the dependence of stress on the resin thickness LB.
Figure 4B:
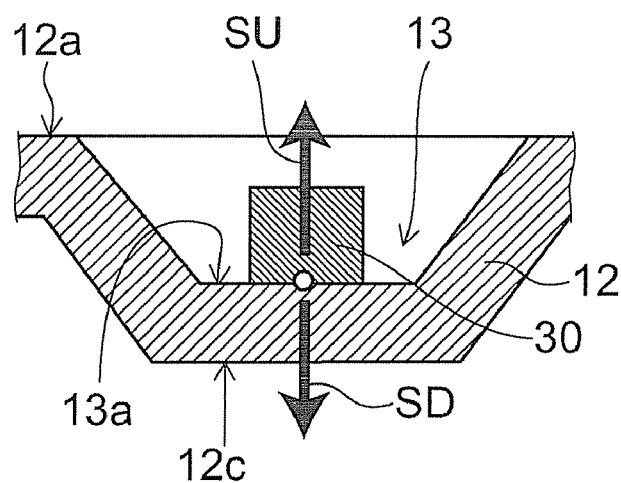
FIG. 4B is a schematic sectional view showing the direction of the stress.

FIG. 4A is a graph showing the dependence of stress on the resin thickness LB, and FIG. 4B is a schematic sectional view showing the direction of the stress.

In FIG. 4A, the vertical axis represents the simulated stress (MPa) occurring due to the temperature change (decrease) from 160° C. to −40° C. The horizontal axis represents the resin thickness LB (mm) between the lens plane 40c and the lower surface 40b of the molded body 40.

As shown in FIG. 4B, the light emitting element chip is subjected to an upward stress SU pulling the chip from the die pad portion 12, and a downward stress SD applied down to the chip.

Up to a resin thickness LB of 2.35 mm (corresponding to the structure of FIG. 3A), an upward stress SU of generally 60 MPa is primarily applied. Beyond a resin thickness LB of 2.35 mm, the downward stress SD starts to increase. The difference in absolute value between the upward stress (SU) and the downward stress (SD) decreases in the order of the structure of FIG. 3B having a resin thickness LB of 2.79 mm and the structure of FIG. 3C having a resin thickness LB of 3.23 mm. That is, the net stress applied to the light emitting element 30 and the die pad portion 12 is reduced. Thus, detachment and cracking of the sealing resin are suppressed.

Furthermore, in the structure of FIG. 3D having a resin thickness LB of 3.73 mm, the position of the barycenter 45 generally coincides with the position of the lower surface 12c of the die pad portion 12. Furthermore, if the resin thickness LB is larger than 3.73 mm, the rate of decrease of the stress slows down. In this embodiment, preferably, the position of the barycenter 45 is set between the lower surface 12c of the die pad portion 12 on the opposite side from the bottom surface 13a of the recess 13, and the plane including the upper end 14u of the bent portion 14. Furthermore, preferably, the position of the barycenter 45 is set inside the region of the light emitting element 30 as viewed from above. Such a barycenter (setting) region 48 is indicated by the dotted line.

More preferably, the vertical position of the barycenter 45 is set between the bottom surface 13a of the recess 13 and the major surface 12a of the die pad portion 12. Then, the net stress applied to the light emitting element 30 is reduced. That is, according to the first embodiment, even if the volume of the molded body 40 is increased to provide a bent portion, the volume below the bottom surface 13a of the recess 13 is increased to bring the barycenter 45 close to the light emitting element 30, thereby reducing the stress occurring due to the difference in linear expansion coefficient between the lead frame and the sealing resin 40. This can suppress detachment at interfaces between the lead frame and the sealing resin 40, and between the light emitting element 30 and the sealing resin 40, and cracking in the sealing resin 40. Furthermore, detachment of the light emitting element 30 from the die pad portion 12 can be suppressed. Thus, the heat resistance of the light emitting element 30 can be improved.

Figure 5A:
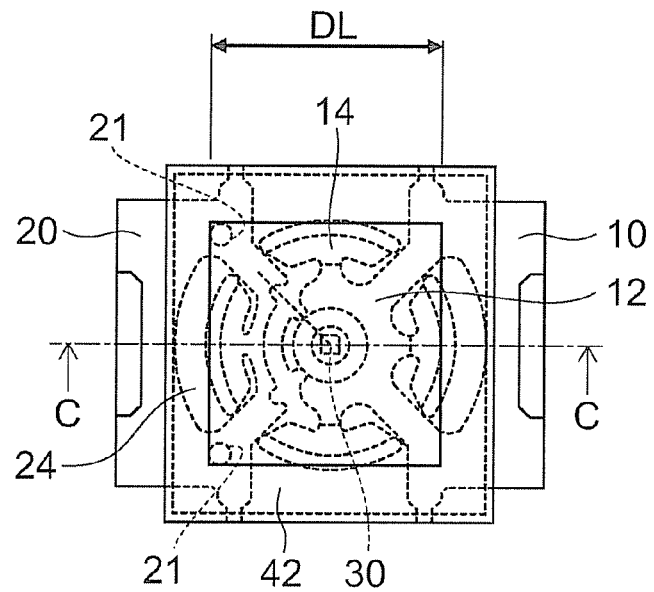
FIG. 5A is a schematic plan view of a light emitting device according to a second embodiment.
Figure 5B:
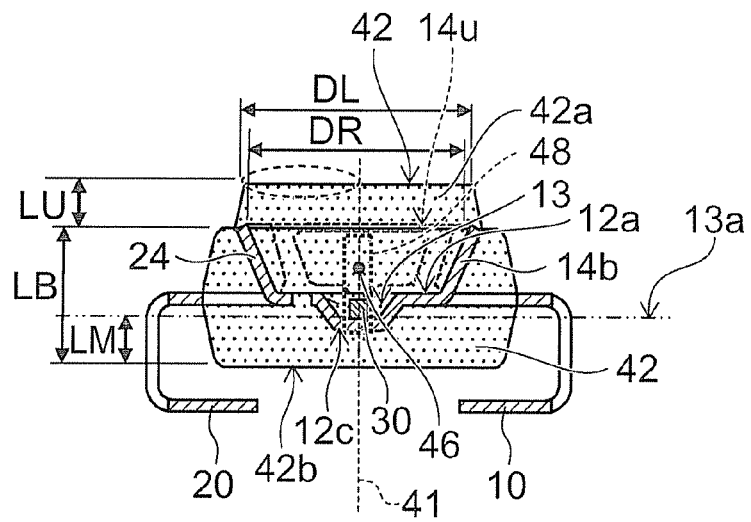
FIG. 5B is a schematic sectional view taken along line C-C.
Figure 5C:
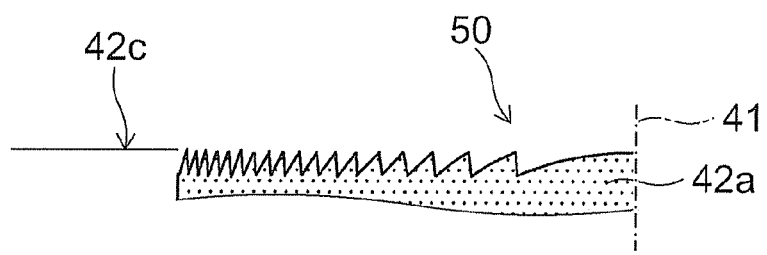
FIG. 5C is a schematic sectional view of a Fresnel lens.

FIG. 5A is a schematic plan view of a light emitting device according to a second embodiment, FIG. 5B is a schematic sectional view taken along line C-C, and FIG. 5C is a schematic sectional view of a Fresnel lens.

The lens can be a Fresnel lens instead of a spherical or convex lens. That is, the cross section of FIG. 5C can be formed at the upper surface of the lens portion 42a. This provides a Fresnel lens 50 for eliminating equiphase planes which do not affect the transformation of wave fronts. Thus, the thickness LU can be reduced.

In this case, even for a small resin thickness LM between the lower surface 42b of the molded body 42 and the bottom surface 13a of the recess 13, the barycenter 46 of the molded body 42 is easily set inside the barycenter (setting) region 48 between the upper end 14u of the bent portion 14 and the lower surface 12c of the die pad portion 12. That is, the volume of the molded body 42 does not need to be increased, and can be set to as small as e.g. 80 mm$^3$. Furthermore, the tip portion of the outer lead can be bent toward the lower surface 42b of the molded body 42, rather than bent in a gull-wing shape. Then, the planar shape of the light emitting device can be downsized.

In the first and second embodiments, the output power of light emitting device is readily increased by the recess provided in the die pad portion and by the bent portion. Furthermore, the barycenter of the molded body made of the sealing resin is brought close to the light emitting element. This reduces the stress applied to the light emitting element and to the recess provided in the lead, and suppresses detachment and cracking of the sealing resin. Thus, the heat resistance is improved, and stable electrical and optical characteristics can be maintained in a wide temperature range. Such a light emitting device is widely applicable to vehicle-mounted exterior lights and traffic lights.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A light emitting device comprising:
   a first lead including a die pad portion having a major surface and a recess provided in the major surface, and a bent portion bent toward above the major surface;
   a light emitting element bonded to a bottom surface of the recess;
   a second lead with one end portion opposed to one end portion of the first lead; and
   a molded body covering the light emitting element, the bent portion, the die pad portion, and the one end portion of the second lead, and made of a resin, another end portion of the first lead and another end portion of the second lead being projected from the molded body,
   a position of barycenter of the molded body being set between a lower surface of the die pad portion on opposite side from the bottom surface of the recess and a plane including an upper end of the bent portion.

2. The device according to claim 1, wherein the position of the barycenter of the molded body is set between the bottom surface of the recess and the major surface of the die pad portion.

3. The device according to claim 1, wherein the second lead includes a bent portion bent toward above a major surface of the second lead.

4. The device according to claim 3, wherein the bent portion of the first lead and the bent portion of the second lead are opened upward and each have a bending angle of 45 degrees or more and 70 degrees or less.

5. The device according to claim 3, wherein the bent portion of the first lead and the bent portion of the second lead have a height of 0.6 mm or more and 1 mm or less.

6. The device according to claim 3, wherein
   slits are provided respectively at both ends of a fold of the bent portion of the first lead and both ends of a fold of the bent portion of the second lead, and
   the molded body penetrates through the slits.

7. A light emitting device comprising:
   a first lead including a die pad portion having a major surface and a recess provided in the major surface, and a first to third bent portions bent toward above the major surface;
   a light emitting element bonded to a bottom surface of the recess;
   a second lead with one end portion opposed to one end portion of the first lead, the second lead including a bent portion bent toward above a major surface, the bent portion being opposed to one of the first to third bent portions of the first lead; and
   a molded body covering the light emitting element, the first to third bent portions, the bent portion of the second lead, and the die pad portion, and made of a resin, another end portion of the first lead and another end portion of the second lead being projected from the molded body, a position of barycenter of the molded body being set between a lower surface of the die pad portion on opposite side from the bottom surface of the recess and a plane including an upper end of the first to third bent portions.

8. The device according to claim 7, wherein the position of the barycenter of the molded body is set between the bottom surface of the recess and the major surface of the die pad portion.

9. The device according to claim 7, wherein the first to third bent portions of the first lead and the bent portion of the second lead are opened upward and each have a bending angle of 45 degrees or more and 70 degrees or less.

10. The device according to claim 7, wherein the first to third bent portions of the first lead and the bent portion of the second lead have a height of 0.6 mm or more and 1 mm or less.

11. The device according to claim 7, wherein
slits are provided at both ends of a fold of the first to third bent portions of the first lead and both ends of a fold of the bent portion of the second lead, and
the molded body penetrates through the slits.

12. A light emitting device comprising:
a first lead including a die pad portion having a major surface and a recess provided in the major surface, and a bent portion bent toward above the major surface;
a light emitting element bonded to a bottom surface of the recess;
a second lead with one end portion opposed to one end portion of the first lead; and
a molded body covering the light emitting element, the bent portion, the die pad portion, and the one end portion of the second lead, and made of a resin, another end portion of the first lead and another end portion of the second lead being projected from the molded body, and the molded body including a light emitting surface made of a convex lens or a Fresnel lens, a position of barycenter of the molded body being set between a lower surface of the die pad portion on opposite side from the bottom surface of the recess and a plane including an upper end of the bent portion.

13. The device according to claim 12, wherein the position of the barycenter of the molded body is set between the bottom surface of the recess and the major surface of the die pad portion.

14. The device according to claim 12, wherein the second lead includes a bent portion bent toward above a major surface of the second lead.

15. The device according to claim 14, wherein
the first lead includes a first to third bent portions, and
the bent portion of the second lead is opposed to one of the first to third bent portions.

16. The device according to claim 15, wherein the first to third bent portions of the first lead and the bent portion of the second lead are opened upward and each have a bending angle of 45 degrees or more and 70 degrees or less.

17. The device according to claim 15, wherein the first to third bent portions of the first lead and the bent portion of the second lead have a height of 0.6 mm or more and 1 mm or less.

18. The device according to claim 14, wherein
slits are provided at both ends of a fold of the first to third bent portions of the first lead and both ends of a fold of the bent portion of the second lead, and
the molded body penetrates through the slits.

19. The device according to claim 12, wherein the upper end of the first to third bent portions lies in the convex lens.

20. The device according to claim 12, wherein a diameter of the convex lens is larger than inner diameter of the plane including the upper end of the first to third bent portion.

* * * * *